United States Patent
Maeda et al.

(10) Patent No.: US 11,340,401 B2
(45) Date of Patent: May 24, 2022

(54) OPTICAL CIRCUIT FOR ALIGNMENT AND OPTICAL ALIGNMENT METHOD

(71) Applicant: Nippon Telegraph and Telephone Corporation, Tokyo (JP)

(72) Inventors: Yoshiho Maeda, Tokyo (JP); Toru Miura, Tokyo (JP); Hiroshi Fukuda, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/973,327

(22) PCT Filed: May 23, 2019

(86) PCT No.: PCT/JP2019/020470
§ 371 (c)(1),
(2) Date: Dec. 8, 2020

(87) PCT Pub. No.: WO2019/244555
PCT Pub. Date: Dec. 26, 2019

(65) Prior Publication Data
US 2021/0208339 A1    Jul. 8, 2021

(30) Foreign Application Priority Data
Jun. 18, 2018 (JP) .............................. JP2018-115148

(51) Int. Cl.
*G02B 6/34* (2006.01)
*G02B 6/30* (2006.01)
*H01L 27/144* (2006.01)

(52) U.S. Cl.
CPC ................. *G02B 6/34* (2013.01); *G02B 6/30* (2013.01); *H01L 27/1446* (2013.01)

(58) Field of Classification Search
CPC .......... G02B 6/30; G02B 6/34; G02B 6/4204; G02B 6/4206; G02B 27/4233; H01L 27/1446; H01L 27/14625; H01L 31/0232; H01L 31/10
USPC .......................................................... 385/37
See application file for complete search history.

(56) References Cited

U.S. PATENT DOCUMENTS

| 7,024,066 B1* | 4/2006 | Malendevich ......... G02B 6/122 385/11 |
| 2016/0315452 A1* | 10/2016 | Chen ..................... H01S 5/1032 |
| 2017/0003449 A1* | 1/2017 | Manouvrier ............ G02F 1/025 |

OTHER PUBLICATIONS

Mekis et al., "A Grating-Coupler-Enabled CMOS Photonics Platform," IEEE Journal of Selected Topics in Quantum Electronics, vol. 17, No. 3, May/Jun. 2011, pp. 597-608.

(Continued)

*Primary Examiner* — Michael P Mooney
(74) *Attorney, Agent, or Firm* — Slater Matsil, LLP (57) ABSTRACT

A photodiode including a p-type region and an n-type region formed in a core of a grating coupler is provided. The p-type region and the n-type region are each formed as a region having a rectangular shape extending in an array direction of a grating as seen in plan view and are arranged in a direction orthogonal to the array direction of the grating and parallel to a plane of a substrate. A plurality of the p-type regions and a plurality of the n-type regions are formed and alternately arranged.

12 Claims, 5 Drawing Sheets

(56) References Cited

OTHER PUBLICATIONS

Taillaert et al."An Out-of-Plane Grating Coupler for Efficient Butt-Coupling Between Compact Planar Waveguides and Single-Mode Fibers," IEEE Journal of Quantum Electronics, vol. 38, No. 7, Jul. 2002, pp. 949-955.

* cited by examiner

PRIOR ART

OPTICAL CIRCUIT FOR ALIGNMENT AND OPTICAL ALIGNMENT METHOD

CROSS-REFERENCE TO RELATED APPLICATIONS

This application is a national phase entry of PCT Application No. PCT/JP2019/020470, filed on May 23, 2019, which claims priority to Japanese Application No. 2018-115148, filed on Jun. 18, 2018, which applications are hereby incorporated herein by reference.

TECHNICAL FIELD

The present invention relates to an alignment optical circuit and an optical alignment method that are used for optical connection between a grating coupler and an optical fiber.

BACKGROUND

As traffic increases in optical communication, there is a demand for cost reduction of optical transmitters and receivers in addition to speeding-up and downsizing. To achieve downsizing and cost reduction of optical transmitters and receivers, optical circuits including components such as optical filters and optical modulators are also required to be manufactured at low cost and have small sizes.

Recently, silicon photonics (SiPh) has attracted attention as a technology of achieving small-sized optical circuits at low cost, and research and development of SiPh optical circuits have been actively performed. Optical transmitters and receivers are exemplary instruments including SiPh optical circuits. Cost of mounting and inspection processes accounts for a large proportion of manufacturing cost of optical transmitters and receivers, and it is important to promote cost reduction of optical transmitters and receivers. For this, it is desirable to inspect SiPh optical circuits on a wafer yet to be cut into chips, perform non-defective product selection, and thereafter cut out the wafer into chips and mount chips of the selected non-defective products into a module.

The inspection of a SiPh optical circuit is typically performed by a method of emitting light from an external light source into the SiPh optical circuit to evaluate insertion loss (IL) and operation characteristics. Thus, a grating coupler through which external light can be coupled to a SiPh optical waveguide is important for the on-wafer inspection.

Conventionally, in inspection using a grating coupler, alignment has been performed by setting the angle, wavelength, and polarized wave of incident light from an optical fiber to designed values, and then moving the optical fiber to search for a point at which the efficiency of optical coupling with the grating coupler is maximum.

An alignment optical circuit including a grating coupler will be described below with reference to FIG. 7. For example, as illustrated in (a) of FIG. 7, an alignment optical circuit includes a grating coupler 302 formed at one end of an optical waveguide formed of a core 301 made of a semiconductor, and a Ge photodiode 303a formed at the other end of the optical waveguide formed of the core 301. In this alignment optical circuit, only light coupled with the grating coupler 302 propagates in the optical waveguide, and photocurrent in the Ge photodiode 303a is obtained as a signal.

Figure 7:
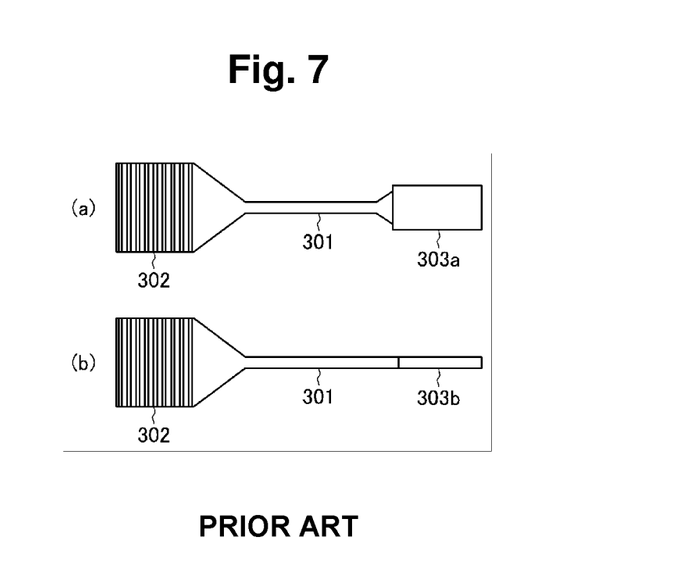
FIG. 7 is a plan view illustrating the configuration of an alignment optical circuit including a grating coupler.

In another alignment optical circuit, as illustrated in (b) of FIG. 7, a reflection part 303b is formed at the other end of the optical waveguide formed of the core 301. In this alignment optical circuit, only light coupled with the grating coupler 302 propagates in the optical waveguide, and return light from the alignment optical circuit is obtained as a signal.

An optical fiber is moved in a wide range (rough alignment) to align the optical fiber and the grating coupler so that each above-described signal becomes maximum.

As disclosed in Non Patent Literature 1, the efficiency of optical coupling with a grating coupler is sensitive not only to plane coordinates but also to the angle, polarized wave, and wavelength of incident light. Thus, for highly efficient optical coupling, it is necessary to match the polarized wave and the wavelength in addition to six-axis alignment with respect to the X axis, the Y axis, the Z axis, and the angles to the respective axes between an optical fiber and the grating coupler.

In such alignment, the position of the optical fiber is moved or swept to place the optical fiber to a position at which optical coupling with the grating coupler is achieved (rough alignment), and then, precise positioning, and angle, wavelength, and polarized wave matching (fine alignment) are performed while the grating coupler and the optical fiber are coupled with each other.

CITATION LIST

Non Patent Literature

Non-Patent Literature 1: D. Taillaert et al., "An Out-of-Plane Grating Coupler for Efficient Butt-Coupling Between Compact Planar Waveguides and Single-Mode Fibers", IEEE Journal of Quantum Electronics, vol. 38, no. 7, pp. 949-955, 2002.

Non-Patent Literature 2: A. Mekis et al., "A Grating-Coupler-Enabled CMOS Photonics Platform", IEEE Journal of Selected Topics in Quantum Electronics, vol. 17, no. 3, pp. 597-608, 2011.

SUMMARY

Technical Problem

As described above, precise alignment and polarized wave and wavelength matching are needed between an optical fiber and a grating coupler to emit light into a SiPh optical circuit. To perform precise alignment and polarized wave and wavelength matching, it is important to have a state in which the optical fiber and the grating coupler are coupled with each other and an alignment signal can be checked.

However, manufacturing variance is large among grating couplers as compared to other optical circuits, and deviation from designed values and inter-individual difference are likely to occur in optimum coupling position, angle and wavelength. Furthermore, in alignment in which return light from an alignment optical circuit is used as a signal, scattering rays from optical-circuit peripheral components on the surface of a substrate on which the optical circuit is formed are superimposed as background noise on the return light. In addition, in alignment in which photocurrent of a photodiode is used as a signal, dark current of the photodiode is superimposed as background noise.

In particular, when the angle, wavelength, and polarized wave of an optical fiber in rough alignment largely shift from optimum conditions, the S/N ratio extremely decreases, and as a result, a response signal from an alignment optical circuit is buried in noise, which leads to difficulties in performing rough alignment and fine alignment thereafter.

An object of embodiments of the present invention, which has been made to solve the above-described problem, is to improve the S/N ratio in optical alignment using an alignment optical circuit.

Means for Solving the Problem

An alignment optical circuit according to embodiments of the present invention includes: an optical waveguide that is formed of a core made of a semiconductor and is formed on a substrate; a grating coupler including a grating formed in the core at one end of the optical waveguide; a reflection part or optical detection part formed at the other end of the optical waveguide and optically coupled with the optical waveguide; and a photodiode including a p-type region and an n-type region formed in the core of the grating coupler.

In the above-described alignment optical circuit, the p-type region and the n-type region are each formed as a region having a rectangular shape extending in an array direction of the grating as seen in plan view and are arranged in a direction orthogonal to the array direction of the grating and parallel to a plane of the substrate.

In the above-described alignment optical circuit, a plurality of the p-type regions and a plurality of the n-type regions are formed and alternately arranged.

In the above-described alignment optical circuit, the semiconductor is silicon.

An optical alignment method according to embodiments of the present invention is an optical alignment method using the above-described alignment optical circuit includes: a first process of performing rough alignment to achieve a state in which alignment light emitted from an optical fiber to be aligned is able to be optically coupled with the grating coupler; and a second process of performing fine alignment to achieve a state in which optical coupling of the alignment light with the grating coupler is maximum after the rough alignment. In the first process, light in which first light guided through the optical waveguide and second light having a wavelength to which the photodiode has sensitivity are multiplexed is guided to the optical fiber to be aligned and emitted as the alignment light from an emission end of the optical fiber.

Effects of Embodiments of the Invention

As described above, according to embodiments of the present invention, it is possible to obtain an excellent effect that a photodiode including a p-type region and an n-type region formed in a core of a grating coupler is provided to improve the S/N ratio in optical alignment using an alignment optical circuit.

DETAILED DESCRIPTION OF ILLUSTRATIVE EMBODIMENTS

Figure 1:
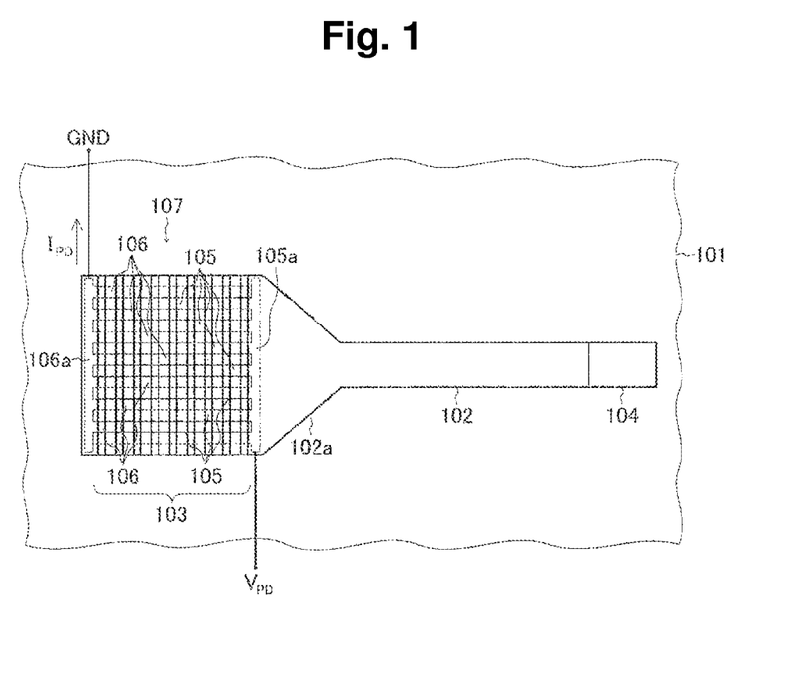
FIG. 1 is a plan view illustrating the configuration of an alignment optical circuit in an embodiment of the present invention.
Figure 2:
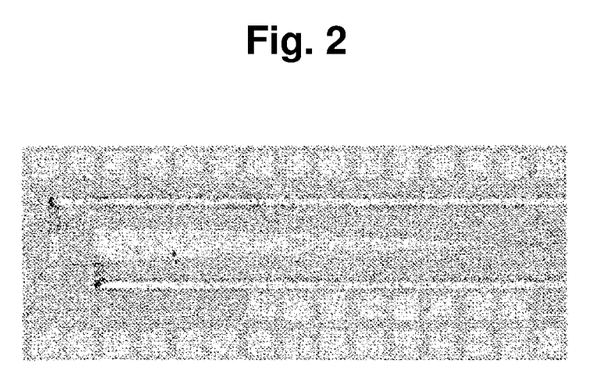
FIG. 2 is an optical microscope picture of an actually produced alignment optical circuit.

An alignment optical circuit in an embodiment of the present invention will be described below with reference to FIGS. 1 and 2. The alignment optical circuit includes an optical waveguide that is formed of a core 102 made of a semiconductor and is formed on a substrate 101. A grating coupler 103 is provided at one end of the optical waveguide.

The grating coupler 103 includes a grating formed from a plurality of grooves formed on the upper surface of the core 102 at the one end of the optical waveguide. The core 102 includes a tapered part 102a having a core width that is gradually larger at a position closer to the one end of the optical waveguide. A tapered optical waveguide is formed of the tapered part 102a. The grating coupler 103 is adiabatically connected with the optical waveguide formed of the core 102 through the tapered optical waveguide formed of the tapered part 102a. The grating coupler 103 may have a structure of, for example, a fan shape as illustrated in FIG. 3 of Non Patent Literature 2.

The alignment optical circuit also includes a reflection part 104 formed at the other end of the above-described optical waveguide and optically coupled with the optical waveguide. An optical detection part may be provided in place of the reflection part 104.

The semiconductor is, for example, silicon. The substrate 101 is, for example, a well-known Silicon-on-Insulator (SOI) substrate in which an embedded insulating layer serves as a lower part clad and a surface silicon layer is patterned to form the core 102, the grating of the grating coupler 103, and the like. The lower part clad thus configured, the core 102, and a space layer serving as an upper part clad above the core 102 form the optical waveguide. The upper part clad may have a double-layered structure of $SiO_2$ and SiN.

In the embodiment, a well-known alignment optical circuit having the above-described configuration includes a photodiode 107 including a p-type region 105 and an n-type region 106 formed in the core 102 of the grating coupler 103. In this example, the p-type region 105 and the n-type region 106 are each formed as a region having a rectangular shape extending in an array direction of the grating as seen in plan view and are arranged in a direction orthogonal to the array direction of the grating and parallel to the plane of the substrate 101.

In this example, a plurality of the p-type regions 105 and a plurality of the n-type regions 106 are formed and alternately arranged. The plurality of p-type regions 105 are connected with a p-type extension 105a at equipotential. The plurality of n-type regions 106 are connected with a n-type extension 106a at equipotential. The plurality of p-type regions 105 and the plurality of n-type regions 106 are formed in comb-teeth shapes with comb teeth alternately meshed with each other. In this example, a pn junction is formed by each p-type region 105 and the corresponding n-type region 106 adjacent thereto.

The p-type extension 105a and the n-type extension 106a are each connected with an electrode so that the n-type extension 106a is grounded and negative bias voltage is applied to the p-type extension 105a. Accordingly, the photodiode 107 including the pn junction of each p-type region 105 and the corresponding n-type region 106 has sensitivity to light having a wavelength shorter than 1.13 µm.

Figure 3:
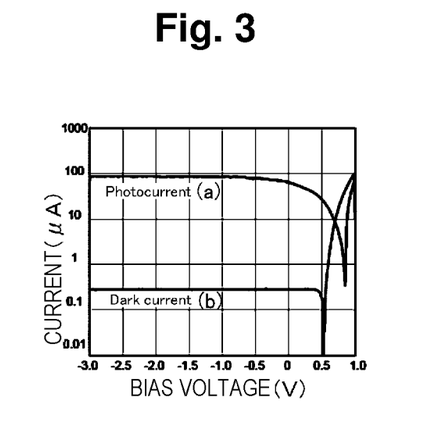
FIG. 3 is a characteristic diagram illustrating a current-voltage characteristic when bias is applied to a photodiode 107 made of silicon.

FIG. 3 illustrates a current-voltage characteristic when bias is applied to the photodiode 107 made of silicon. FIG. 3 illustrates photocurrent (a) and dark current (b) when red light having a wavelength of 635 nm is incident at 2 W. Light receiving sensitivity estimated from a result is 0.05 A/W approximately.

The width of the core 102, the width of the grating coupler 103, the length of the grating coupler 103, and the period (groove pitch), duty ratio, and groove depth of the grating included in the grating coupler 103 are set as appropriate in accordance with designing of the alignment optical circuit. For example, the core 102 may have a width of 0.44 µm and a height of 0.22 µm in section view. The grating coupler 103 may have a width of 20 µm, a length of 30 µm, a groove pitch of 0.635 µm, a duty ratio of 0.5, and a groove depth of 0.07 µm.

Next, an optical alignment method using the alignment optical circuit in the embodiment of the present invention will be described below with reference to FIGS. 4A and 4B.

First, rough alignment is performed to achieve a state in which alignment light emitted from an optical fiber to be aligned is able to be optically coupled with the grating coupler 103 (first process). When the optical waveguide and the photodiode 107 are made of silicon, light in which first light (signal light) guided through the optical waveguide and second light (rough alignment light) having a wavelength to which the photodiode 107 has sensitivity are multiplexed is guided to the optical fiber to be aligned and emitted as the alignment light from an emission end.

Figure 4A:
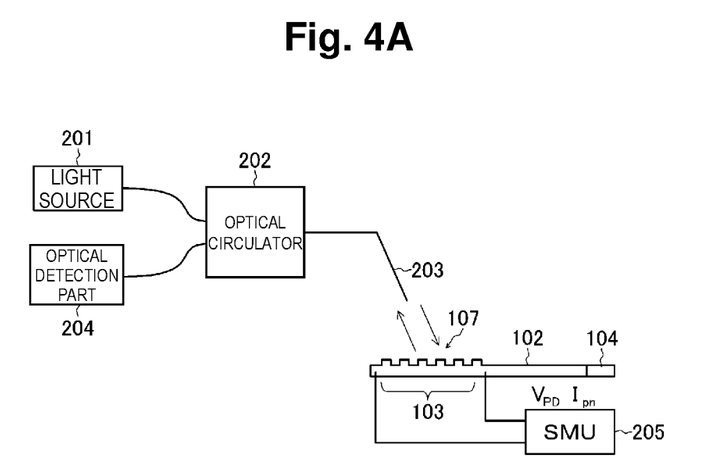
FIG. 4A is a configuration diagram for description of an optical alignment method using the alignment optical circuit in the embodiment of the present invention.
Figure 4B:
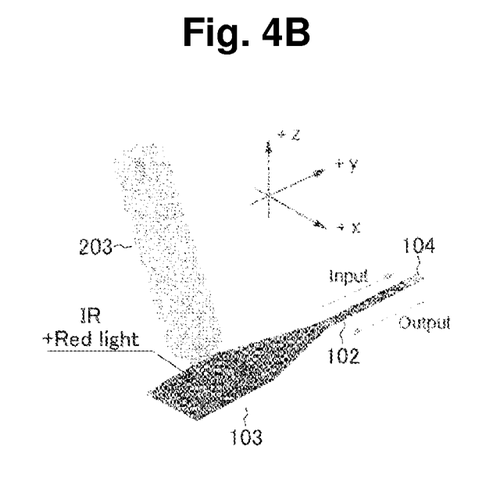
FIG. 4B is a perspective view for description of the optical alignment method using the alignment optical circuit in the embodiment of the present invention.

For example, as illustrated in FIG. 4A, light-source light in which red light (a wavelength of 635 nm) for the rough alignment and IR light (a wavelength of 1550 nm) as the signal light are wavelength-multiplexed is generated by a light source 201 and guided to an optical fiber 203 through an optical circulator 202. In this state, the optical fiber 203 is moved. The rough alignment light for the rough alignment is not limited to red light having a wavelength of 635 nm but may be light having a wavelength of 1.13 µm or shorter to which the photodiode 107 made of silicon has sensitivity. Moreover, a desired wavelength may be selected for the signal light in accordance with designing of the alignment optical circuit.

In the above-described configuration, when the light-source light having emitted the optical fiber 203 is coupled with the grating coupler 103, the signal light in the light-source light propagates through the optical waveguide formed of the core 102. When the reflection part 104 is provided at the other end of the optical waveguide, return light reflected by the reflection part 104 is received by the optical fiber 203 again and detected by a light detector 204 through the optical circulator 202. Thus, alignment can be performed based on the return light by moving the optical fiber 203 while the light detector 204 monitors the signal light. When an optical detection part such as a Ge photodiode is provided at the other end of the optical waveguide in place of the reflection part 104, alignment can be performed based on photocurrent in the optical detection part.

When the light-source light emitted from the optical fiber 203 is coupled with the grating coupler 103, red light (the rough alignment light) in the light-source light is absorbed by the photodiode 107 provided in the grating coupler 103. Simultaneously with the above-described alignment, alignment using the red light can be performed based on the signal light by monitoring, with a source measure unit (SMU) 205, photocurrent generated through photoelectric conversion upon the red light absorption while applying negative bias to the photodiode 107.

Through the red light alignment, the rough alignment relative to the grating coupler 103 is performed (first process). Then, fine alignment and angle, polarized wave, and wavelength matching are performed by using the signal light while weak coupling with the grating coupler 103 is held through the rough alignment (second process).

In the red light alignment, the red light is directly absorbed by the photodiode 107 formed in the region of the grating coupler 103 and is not related to the efficiency of optical coupling of the grating coupler 103. In addition, the red light alignment is unlikely to be affected by scattering rays from surroundings like the return light alignment. Thus, the rough alignment can be performed at a higher S/N ratio than the conventional alignment described with reference to FIG. 7.

Figure 5A:
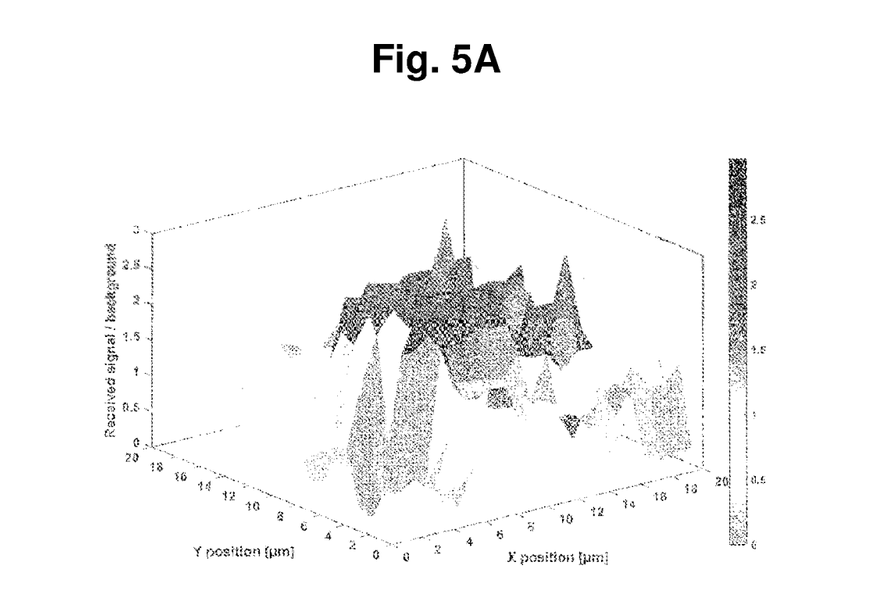
FIG. 5A is a distribution map plotting received signal distribution against the position of an optical fiber when rough alignment is performed with the alignment optical circuit in the embodiment.
Figure 5B:
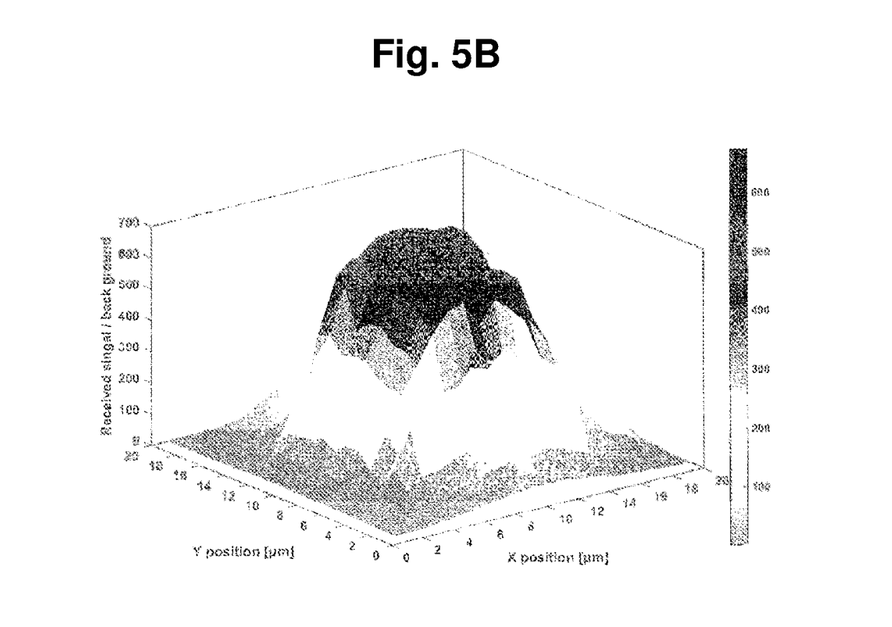
FIG. 5B is a distribution map plotting received signal distribution against the position of the optical fiber when the rough alignment is performed with the alignment optical circuit in the embodiment.

FIGS. 5A and 5B illustrate received signal distribution against the position of the optical fiber when the rough alignment is performed with the alignment optical circuit in the above-described embodiment. FIG. 5A illustrates received signal distribution for the IR light (signal light). FIG. 5B illustrates received signal distribution for the red light (rough alignment light). The angle of the optical fiber is 10°, the wavelength of the IR light is 1550 nm, and the height from the grating coupler to the emission end of the optical fiber is 100 µm approximately.

Figure 6:
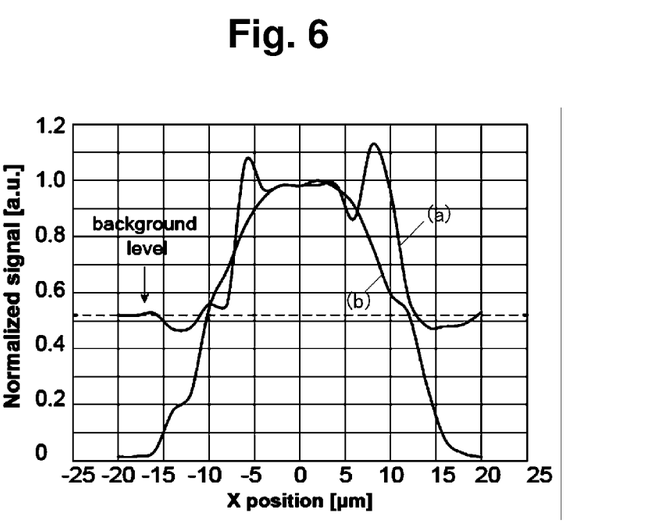
FIG. 6 is a characteristic diagram illustrating an X-axis section profile at the central position in each of FIGS. 5A and 5B.

FIG. 6 illustrates an X-axis section profile at the central position in each of FIGS. 5A and 5B. In FIG. 6, (a) indicates an X-axis section profile of received signal distribution for the IR light (signal light) at the central position. In FIG. 6, (b) indicates an X-axis section profile of received signal distribution for the red light (rough alignment light) at the central position. As illustrated in FIG. 6, the received signal (a) for the IR light has a large background noise component, and the S/N ratio is only 3 dB approximately. However, the received signal (b) for the red light has a high S/N ratio of 20 dB approximately.

As understood from these results, according to the embodiment, the rough alignment can be performed without influence on S/N ratio decrease by background noise due to scattering rays from peripheral components of the grating coupler and the optical circuit and error in the angle, wavelength, and polarized wave of the optical fiber, and then the fine alignment can be performed thereafter.

As described above, according to embodiments of the present invention, since the photodiode including the p-type regions and the n-type regions formed in the core of the grating coupler is provided to improve the S/N ratio in optical alignment using the alignment optical circuit, alignment between the optical fiber and the grating coupler of the alignment optical circuit can be performed without being buried n noise.

The present invention is not limited to the above-described embodiment but may be provided with a large number of modifications and combinations within the technical idea of the present invention by those having normal knowledge in the field.

REFERENCE SIGNS LIST 101 substrate
102 core
102a tapered part
103 grating coupler
104 reflection part
105 p-type region
105a p-type extension
106 n-type region
106a n-type extension
107 photodiode.

The invention claimed is:

1. An alignment optical circuit comprising:
an optical waveguide on a substrate and comprising a semiconductor core;
a grating coupler including a grating in the semiconductor core at a first end of the optical waveguide;
a reflector or optical detector at a second end of the optical waveguide and optically coupled with the optical waveguide; and
a photodiode including a p-type region and an n-type region in the grating of the grating coupler.

2. The alignment optical circuit according to claim 1, wherein the p-type region and the n-type region each have a rectangular shape in a plan view and extending in an array direction of the grating, wherein the p-type region and the n-type region are each arranged in a direction orthogonal to the array direction of the grating and parallel to a top surface of the substrate.

3. The alignment optical circuit according to claim 2, wherein a plurality of p-type regions and a plurality of n-type regions are alternately arranged in the semiconductor core.

4. The alignment optical circuit according to claim 1, wherein the semiconductor core comprises silicon.

5. The alignment optical circuit according to claim 1, wherein the optical detector is a germanium photodiode.

6. An optical alignment method comprising:
performing rough alignment to achieve a state in which alignment light emitted from an optical fiber to be aligned is optically coupled with a grating coupler of an alignment optical circuit, wherein performing the rough alignment comprises guiding a third light to the optical fiber to be aligned and emitted as the alignment light from an emission end of the optical fiber, and wherein the third light results from multiplexing a first light guided through an optical waveguide and a second light having a wavelength to which a photodiode of the alignment optical circuit has sensitivity; and
performing fine alignment to achieve a state in which optical coupling of the alignment light with the grating coupler is increased after the rough alignment.

7. The method according to claim 6, wherein the alignment optical circuit comprises:
the optical waveguide, the optical waveguide being on a substrate and comprising a semiconductor core;
a grating coupler including a grating in the semiconductor core at a first end of the optical waveguide;
a reflector or optical detector at a second end of the optical waveguide and optically coupled with the optical waveguide; and
the photodiode, the photodiode including a p-type region and an n-type region in the grating of the grating coupler.

8. The method according to claim 7, wherein the p-type region and the n-type region each have a rectangular shape in a plan view and extending in an array direction of the grating, wherein the p-type region and the n-type region are each arranged in a direction orthogonal to the array direction of the grating and parallel to a top surface of the substrate.

9. The method according to claim 7, wherein a plurality of p-type regions and a plurality of n-type regions are alternately arranged in the semiconductor core.

10. The method according to claim 7, wherein the semiconductor core comprises silicon.

11. The method according to claim 7, wherein the rough alignment and the fine alignment are performed based on light reflected from the reflector.

12. The method according to claim 7, wherein the optical detector is a germanium photodiode.

* * * * *